US009087963B2

(12) United States Patent
Higashida et al.

(10) Patent No.: US 9,087,963 B2
(45) Date of Patent: Jul. 21, 2015

(54) APPARATUS FOR MANUFACTURING THERMOELECTRIC CONVERSION ELEMENT

(75) Inventors: Takaaki Higashida, Osaka (JP); Takashi Kubo, Osaka (JP); Kaori Toyoda, Hyogo (JP); Satoshi Maeshima, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 564 days.

(21) Appl. No.: 13/444,147

(22) Filed: Apr. 11, 2012

(65) Prior Publication Data

US 2012/0263207 A1    Oct. 18, 2012

(30) Foreign Application Priority Data

Apr. 12, 2011  (JP) ................................. 2011-087877
Feb. 15, 2012  (JP) ................................. 2012-030905

(51) Int. Cl.
*H01L 35/34*    (2006.01)
*F27D 3/14*    (2006.01)

(52) U.S. Cl.
CPC .  *H01L 35/34* (2013.01); *F27D 3/14* (2013.01)

(58) Field of Classification Search
CPC ..................................................... H01L 35/34
USPC ........... 373/1, 79, 85, 86, 111, 116, 142, 146, 373/166; 136/201, 230
See application file for complete search history.

(56) References Cited

U.S. PATENT DOCUMENTS

| | | | | | |
|---|---|---|---|---|---|
| 916,314 | A | * | 3/1909 | Hitt | ................................ 137/74 |
| 1,920,325 | A | * | 8/1933 | Schmidt | ........................ 373/146 |
| 2,536,325 | A | * | 1/1951 | Tama | ............................. 373/146 |
| 2,536,859 | A | * | 1/1951 | Tama | ............................. 373/142 |
| 2,997,756 | A | * | 8/1961 | Strom | ............................. 164/62 |
| 3,212,767 | A | * | 10/1965 | Muller | .......................... 266/210 |
| 3,670,799 | A | * | 6/1972 | Vogel et al. | ..................... 164/63 |

(Continued)

FOREIGN PATENT DOCUMENTS

| | | |
|---|---|---|
| CN | 101298641 | 11/2008 |
| CN | 101533888 | 9/2009 |

(Continued)

OTHER PUBLICATIONS

English translation of Search Report dated Apr. 14, 2014 for Chinese Patent Application No. 201210101469.5.

*Primary Examiner* — Dana Ross
*Assistant Examiner* — John J Norton
(74) *Attorney, Agent, or Firm* — Panasonic Patent Center (57) ABSTRACT

The present invention relates to an apparatus and a method for manufacturing a thermoelectric conversion element. The present invention provides an apparatus for manufacturing a thermoelectric conversion element that can easily realize a high-density array of thermoelectric conversion elements and secure connection reliability. This is an apparatus for manufacturing a thermoelectric conversion element that sucks a p-type or n-type thermoelectric conversion material into heat-resisting insulating tube 102 and includes preheating apparatus 205 that can heat tube 102 to a predetermined temperature before sucking the melted thermoelectric conversion element. Tube 102 whose temperature condition is adjusted by being heated by preheating apparatus 205 is inserted into crucible 204 and the molten thermoelectric conversion material is sucked into tube 102 by decompression apparatus 201.

6 Claims, 7 Drawing Sheets

(56) References Cited

U.S. PATENT DOCUMENTS

| | | | |
|---|---|---|---|
| 3,700,779 A * | 10/1972 | Pomey | 373/140 |
| 3,737,302 A * | 6/1973 | Pomey | 75/10.64 |
| 3,800,634 A * | 4/1974 | Clayton | 81/9.3 |
| 3,815,623 A * | 6/1974 | Farmer | 137/142 |
| 4,147,474 A * | 4/1979 | Heimdal et al. | 417/54 |
| 4,178,986 A * | 12/1979 | Smashey | 164/513 |
| 4,298,376 A * | 11/1981 | Narita et al. | 75/510 |
| 4,668,288 A * | 5/1987 | Ouchi et al. | 75/10.14 |
| 4,763,717 A * | 8/1988 | Lajoye | 164/258 |
| 5,042,561 A * | 8/1991 | Chandley | 164/63 |
| 5,111,871 A * | 5/1992 | Cook | 164/63 |
| 5,952,728 A * | 9/1999 | Imanishi et al. | 62/3.2 |
| 6,334,975 B1 * | 1/2002 | Yokote et al. | 266/94 |
| 2001/0008115 A1 * | 7/2001 | Kawase et al. | 117/13 |
| 2002/0053317 A1 * | 5/2002 | Pandelisev | 117/84 |
| 2004/0231124 A1 * | 11/2004 | Morimoto et al. | 29/419.1 |
| 2007/0062571 A1 * | 3/2007 | Hayashi | 136/201 |

FOREIGN PATENT DOCUMENTS

| | | |
|---|---|---|
| JP | 61-201484 | 9/1986 |
| JP | 05-152616 | 6/1993 |
| JP | 08-228027 | 9/1996 |
| JP | 10-290030 | 10/1998 |
| JP | 11-261119 | 9/1999 |
| JP | 2003-298122 | 10/2003 |
| JP | 3882047 | 2/2007 |
| JP | 2007-281070 | 10/2007 |

* cited by examiner

APPARATUS FOR MANUFACTURING THERMOELECTRIC CONVERSION ELEMENT

TECHNICAL FIELD

The present invention relates to a method and an apparatus for manufacturing a thermoelectric conversion element.

BACKGROUND ART

Elements taking advantage of a Peltier effect or Seebeck effect are used as thermoelectric conversion elements. Since thermoelectric conversion elements have a simple structure, are easy to handle and able to maintain a stable characteristic, widespread use of thermoelectric conversion elements is attracting attention in recent years. Especially when used as an electronic cooling element, the thermoelectric conversion element can perform local cooling and accurate control over temperature close to a room temperature, and therefore a wide range of studies are being carried forward aiming at temperature stabilization of opto-electronics and semiconductor laser or the like.

Figure 7:
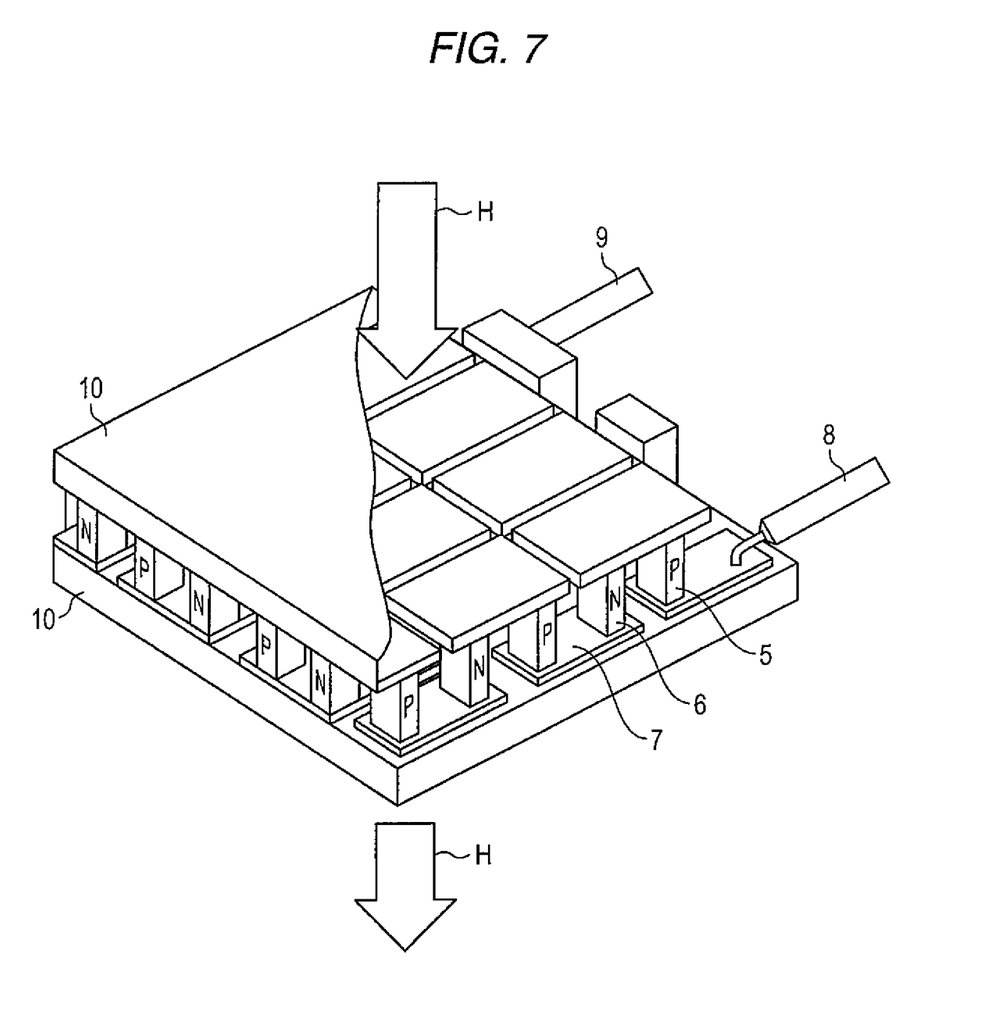
FIG. 7 is a schematic view showing a conventional thermoelectric conversion module.

The aforementioned electronic cooling element or thermoelectric module used for thermoelectric power generation is configured as shown in FIG. 7 by connecting p-type thermoelectric conversion element (p-type semiconductor) 5 and n-type thermoelectric conversion element (n-type semiconductor) 6 via a connection electrode (metal electrode) 7 to form a pn element pair and arranging a plurality of such pn element pairs in series. At this time, depending on the direction of a current flowing through each pn element pair, one end of p-type thermoelectric conversion element 5 and n-type thermoelectric conversion element 6 is heated and the other end is cooled. In FIG. 7, reference numerals 8 and 9 denote external connection terminals, 10 denotes a ceramic substrate and H denotes an arrow indicating a heat flow direction.

For the material of this thermoelectric conversion element, a material having large performance index Z ($=\alpha^2/\rho K$) expressed by Seebeck coefficient $\alpha$ which is a substance-specific constant, specific resistance $\rho$ and thermal conductivity K is used in the temperature region where the element is used. Crystal materials generally used as thermoelectric conversion elements are $Bi_2Te_3$-based materials and these crystals have an outstanding cleavage property and these crystals are known to have a problem that after undergoing slicing and dicing steps or the like to obtain a thermoelectric conversion element from an ingot, the yield becomes extremely small due to cracking or chipping.

To solve this problem, a method for manufacturing a thermoelectric conversion element module is being tried, which undergoes various steps such as a heating step of mixing material powders so as to have a desired composition and heating/melting the mixture, a coagulation step of forming a solid solution ingot of a thermoelectrically converted material having a rhombohedral structure (hexagonal structure), a crushing step of cursing the solid solution ingot and forming solid solution powder, a sizing step of uniformalizing the grain size of the solid solution powder, a sintering step of sintering the solid solution powder of the uniformalized grain size under a pressure, and a hot upset forging step of making the powder sintered substance plastic-deformed in hot pressing and rolling and thereby orienting crystal grains of a powder sintered structure in a crystal orientation of an excellent performance index or the like (e.g., see Patent Literature 1).

Furthermore, as a conventional method for manufacturing a thermoelectric conversion element module, a manufacturing method is known, which includes a step of manufacturing an alloy ingot, a crushing step of crushing the alloy ingot under a vacuum with an oxygen concentration of 100 ppm or below or under an atmosphere of inert gas into raw powder having an average powder grain size of 0.1 μm or above and 1 μm or below and a sintering step of sintering the raw powder through electric resistance heating while adding a pressure to the raw powder. In the sintering step, a pulse-shaped current is made to flow, the raw powder is sintered with its joule heat and a pressure of 100 kg/cm² or above and 1,000 kg/cm² or below (9.8 MPa or above and 98.1 MPa or below) is added to the raw powder during the sintering. This manufacturing method allows a thermoelectric conversion material of a fine crystal grain size and with excellent workability to be manufactured (e.g., see Patent Literature 2).

Furthermore, as a conventional method for manufacturing a thermoelectric conversion element module, a method is known whereby an entire tube made of a heat-resisting insulating material is accommodated in a crucible that accommodates a molten thermoelectric conversion material and the molten thermoelectric conversion material is filled into the tube under a pressure (e.g., see Patent Literatures 3 to 6). Furthermore, as a method for manufacturing a thermoelectric conversion element, a method is known whereby one end of a glass capillary is inserted into a molten thermoelectric conversion material, the thermoelectric conversion material is sucked up, the thermoelectric conversion material is coagulated, the capillary is cut and a thermoelectric conversion element is thereby obtained (e.g., see Patent Literature 7).

CITATION LIST

Patent Literature

Patent Literature 1: Japanese Patent Application Laid-Open No. 11-261119
Patent Literature 2: Japanese Patent Application Laid-Open No. 2003-298122
Patent Literature 3: Japanese Patent Application Laid-Open No. 10-290030
Patent Literature 4: Japanese Patent Application Laid-Open No. 5-152616
Patent Literature 5: Japanese Patent Application Laid-Open No. 8-228027
Patent Literature 6: Japanese Patent Application Laid-Open No. 2007-281070
Patent Literature 7: Japanese Patent Application Laid-Open No. 61-201484

SUMMARY OF INVENTION

Technical Problem

However, since the thermoelectric conversion element module requires a temperature difference between the high temperature side and the low temperature side, thermal stress is imposed on the thermoelectric conversion element and the connection electrode due to a difference in thermal expansion caused by the temperature difference. For this reason, when the temperature difference is increased in an attempt to obtain a large potential difference, stress at the junction between the thermoelectric conversion element and the connection electrode increases. In the conventional thermoelectric conversion element module, the connection electrode is connected to only the thermoelectric conversion element. Therefore, reliability of the junction against the stress is not high. Furthermore, since the conventional thermoelectric conversion element module is manufactured by individually mounting thermoelectric conversion elements one by one, there is a problem that a high-density array of thermoelectric conversion elements becomes difficult and the output that can be extracted becomes smaller.

Furthermore, for example, the manufacturing method and apparatus as described in Patent Literature 1 has a problem that it is difficult to form an insulating layer between a plurality of thermoelectric conversion elements and it is not possible to realize a high-density array of the above-described thermoelectric conversion elements.

Furthermore, according to the manufacturing method described in Patent Literature 7, the thermoelectric conversion material may fall out of a capillary of the thermoelectric conversion element acquired or cracking or chipping may occur in the thermoelectric conversion material. For this reason, there is a problem that connection reliability cannot be improved.

The present invention is intended to solve the above-described conventional problems and it is an object of the present invention to provide an apparatus and a method for manufacturing a thermoelectric conversion element facilitating a high-density array and offering high connection reliability.

Solution to Problem

As means for attaining the above-described object, the present invention provides an apparatus for manufacturing a thermoelectric conversion element, which will be described below.

According to a first aspect of the present invention, an apparatus for manufacturing a thermoelectric conversion element, including:

a crucible configured to store a molten thermoelectric conversion material;

a heating apparatus arranged on an outer perimeter of the crucible, the heating apparatus is configured to heat the thermoelectric conversion material in the crucible;

a preheating apparatus arranged above the crucible, having a passage configured to communicate inside part of the crucible and outside of the preheating apparatus, and insert the tube, having a heating source different from the heating apparatus, the preheating apparatus is configured to heat a tube made of heat-resisting insulating material, the one end of the tube arranged to be inserted in the crucible via the passage; and a decompression apparatus connected to the other end of the tube is provide.

According to a second aspect of the present invention, a method for manufacturing a thermoelectric conversion element, including:

preheating one end of a tube made of a heat-resisting insulating material;

introducing one end of the tube into a crucible that stores a molten thermoelectric conversion material;

sucking the molten thermoelectric conversion material from the other end of the tube to fill the thermoelectric conversion material into the tube;

solidifying the thermoelectric conversion material filled in the tube; and cutting the tube is provided.

Advantageous Effects of Invention

The present invention can realize an apparatus and a method for manufacturing a thermoelectric conversion element facilitating a high-density array and offering high connection reliability.

BRIEF DESCRIPTION OF DRAWINGS

FIG. 3(a) to FIG. 3(e) are diagrams illustrating an overview of manufacturing steps of the thermoelectric conversion element according to the present invention;

DESCRIPTION OF EMBODIMENTS

An apparatus for manufacturing a thermoelectric conversion element according to the present invention includes: a crucible that can store a molten thermoelectric conversion material; a heating apparatus that is arranged on an outer perimeter of the crucible and heats the thermoelectric conversion material in the crucible; a preheating apparatus that is arranged above the crucible, includes a passage that communicates parts inside and outside the crucible, includes a heating source different from the heating apparatus and heats the heat-resisting insulating material inserted in the passage; and a decompression apparatus connected to one end of the tube.

The crucible is a recipient for heating and melting a thermoelectric conversion material and storing the molten thermoelectric conversion material. The crucible is made of a material having heat-resisting and heat insulating properties corresponding to a melting temperature of the thermoelectric conversion material. An example of the material for the crucible is carbon. Examples of the thermoelectric conversion material include a bismuth-tellurium (Bi—Te) alloy, lead-tellurium (Pb—Te) alloy and silicon-germanium (Si—Ge) alloy. A bismuth-tellurium alloy is used when a temperature difference during use of the thermoelectric conversion element ranges from a room temperature to 500K, a lead-tellurium alloy is used when the temperature difference ranges from a room temperature to 800K and a silicon-germanium alloy is used when the temperature difference ranges from a room temperature to about 1,000K.

The heating apparatus is an apparatus for heating and melting a thermoelectric conversion material in the crucible and for maintaining the temperature of the molten thermoelectric conversion material at a temperature equal to or higher than a melting temperature of the thermoelectric conversion material. The heating apparatus is, for example, a resistance heating apparatus that performs resistance heating, an induction heating apparatus that performs induction heating, a dielectric heating apparatus that performs dielectric heating or an arc heating apparatus that performs arc heating. The heating apparatus is preferably an induction heating apparatus from the standpoint of heating the thermoelectric conversion material so that the temperature of the thermoelectric conversion material speedily reaches the melting temperature.

The preheating apparatus is an apparatus for heating the tube inserted into a passage that communicates parts inside and outside the crucible. The preheating apparatus may be an apparatus for heating a thermo-conductive cylindrical member that makes up the passage or an apparatus for heating a heat conductive member that contacts the tube in the passage or an apparatus that forms the passage using, for example, a coil of conductive wire.

The heating source of the preheating apparatus normally heats the tube in the passage to a temperature between a temperature equal to or higher than a room temperature (e.g. 25° C.) and a melting temperature of the thermoelectric conversion material. The heating source preferably heats the tube to about 350 to about 450° C. from the standpoint of aligning the crystal orientation of the thermoelectric conversion material in the tube in a direction in which the thermoelectric conversion capacity of the thermoelectric conversion material increases more.

The preheating apparatus is preferably an apparatus that heats the tube in the passage having a length greater than the insertion length of the tube in the chamber (e.g., distance from the top end of the chamber to the base of the crucible) from the standpoint of aligning the crystal orientation of the thermoelectric conversion material in the tube in a direction in which the thermoelectric conversion capacity of the thermoelectric conversion material increases more.

The preheating apparatus may be an apparatus that uniformly heats the tube in the passage or an apparatus that heats the tube in the passage so as to form a plurality of temperature bands along the axial direction of the tube. The temperatures of the plurality of temperature bands are preferably higher for a temperature band closer to the chamber and lower for the temperature band farther from the chamber from the standpoint of preventing cracking or deformation of the tube. Furthermore, such a temperature gradient is also preferable from the standpoint of preventing the thermoelectric conversion material from falling out of the tube when the thermoelectric conversion material drastically shrinks during coagulation.

The heating source of the preheating apparatus is, for example, the resistance heating apparatus, the induction heating apparatus, the dielectric heating apparatus or the arc heating apparatus. When the heating apparatus is an induction heating apparatus using induction heating, the heating source is preferably a heating apparatus using heating other than induction heating from the standpoint of preventing electrical coupling between the heating apparatus and the preheating apparatus. For example, when the heating apparatus is an induction heating apparatus, the heating source is a resistance heating apparatus.

The decompression apparatus is an apparatus that induces negative pressure within the tube to suck up the molten thermoelectric conversion material from the crucible into the tube. The decompression apparatus is normally connected to an end of the tube via a pipe (e.g., pressure resistant tube) which is hermetically connected to the end of the tube. The decompression apparatus is an apparatus that can reduce the pressure in the tube down to a pressure lower than an atmospheric pressure (about 1 MPa), for example, about 80 kPa. The decompression apparatus is, for example, a vacuum pump or syringe.

The apparatus for manufacturing a thermoelectric conversion element of the present invention may also have components other than the aforementioned ones. Examples of such other components include a chamber, buffer chamber, inner cover and electromagnetic wave shielding layer.

The chamber is a chamber that accommodates a crucible and a heating apparatus, which will be described later. The chamber is made of a material having heat-resisting and heat insulating properties corresponding to a melting temperature of the thermoelectric conversion material. Furthermore, the chamber includes an opening through which the tube made of a heat-resisting insulating material, which will be described later, is inserted from the passage of the preheating apparatus, which will be described later. The chamber may further include a cover to open/close the opening.

Figure 5:
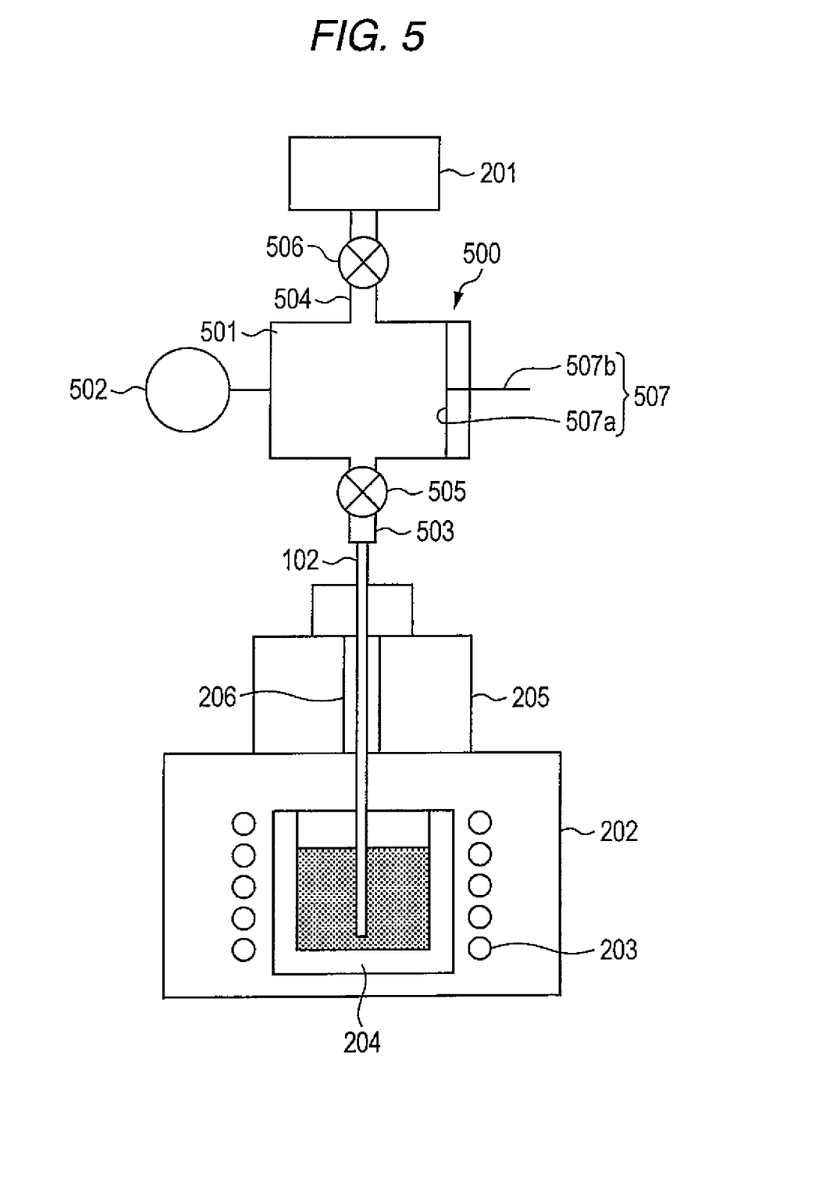
FIG. 5 is a diagram illustrating an overview of a second example of the apparatus for manufacturing a thermoelectric conversion element according to the present invention.

The buffer chamber is connected to the decompression apparatus and also connected to the end of the tube and can freely open/close independently of the decompression apparatus and the pipe. The buffer chamber preferably has a volume adjustable structure from the standpoint of adjusting the amount of sucking of the molten thermoelectric conversion material. An example of the volume adjustable structure is a structure in which one wall surface of the buffer chamber is made up of a piston which can freely move forward or backward within the buffer chamber and can be fixed at a desired position (FIG. 5).

A pressure gauge for indicating a pressure inside the buffer chamber (or decompression degree) is preferably further provided from the standpoint of adjusting the decompression degree of the buffer chamber. Adjusting the decompression degree of the buffer chamber allows the speed of sucking the molten thermoelectric conversion material to be adjusted.

The buffer chamber can form a space including a desired decompression degree and a desired volume. Therefore, the buffer chamber is more preferable from the standpoint of making constant the condition of sucking the molten thermoelectric conversion material into the tube.

The inner cover is a member accommodated in the crucible. The inner cover includes a through-hole through which the tube inserted into the crucible through the passage is passed. The inner cover is made of a material having heat-resisting properties corresponding to the melting temperature of the thermoelectric conversion material and having a smaller density than that of the molten thermoelectric conversion material. An example of the material of the inner cover is carbon. As shown in FIG. 6B, Gap A is preferably formed between the outer perimeter of the inner cover and the inner perimeter wall of the crucible from the standpoint of keeping the inner cover in absolute contact with the liquid surface of the molten thermoelectric conversion material. On the other hand, gap A is preferably small from the standpoint of reducing a change in the composition of the molten thermoelectric conversion material.

As shown in FIG. 6B, Gap B is preferably formed between the perimeter wall of the through-hole of the inner cover and the tube from the standpoint of making easier the insertion of the tube into the crucible. On the other hand, gap B is preferably small from the standpoint of reducing a change in the composition of the molten thermoelectric conversion material.

When both the heating apparatus and the preheating apparatus are induction heating apparatuses, the electromagnetic wave shielding layer is arranged between the chamber and the preheating apparatus. The electromagnetic wave shielding layer is a layer that can shield electromagnetic wave to an extent that between the heating apparatus and the preheating apparatus, electromagnetic wave of one apparatus does not affect the output of the other apparatus. The electromagnetic wave shielding layer is a conductive layer and is, for example, metal film, resin layer over which metal powder is scattered or conductive paste containing a conductive metal.

A method for manufacturing a thermoelectric conversion element according to the present invention preheats one end of a tube made of a heat-resisting insulating material; introduces one end of the tube into a crucible that stores a molten thermoelectric conversion material, sucks a gas in the tube from the other end of the tube to fill the thermoelectric conversion material into the tube; solidifies the thermoelectric conversion material filled in the tube; and cuts the tube. This manufacturing method can be implemented using the aforementioned manufacturing apparatus of the present invention.

Hereinafter, embodiments of the present invention will be described with reference to the accompanying drawings.

Embodiment 1

Figures 1A, 1B:
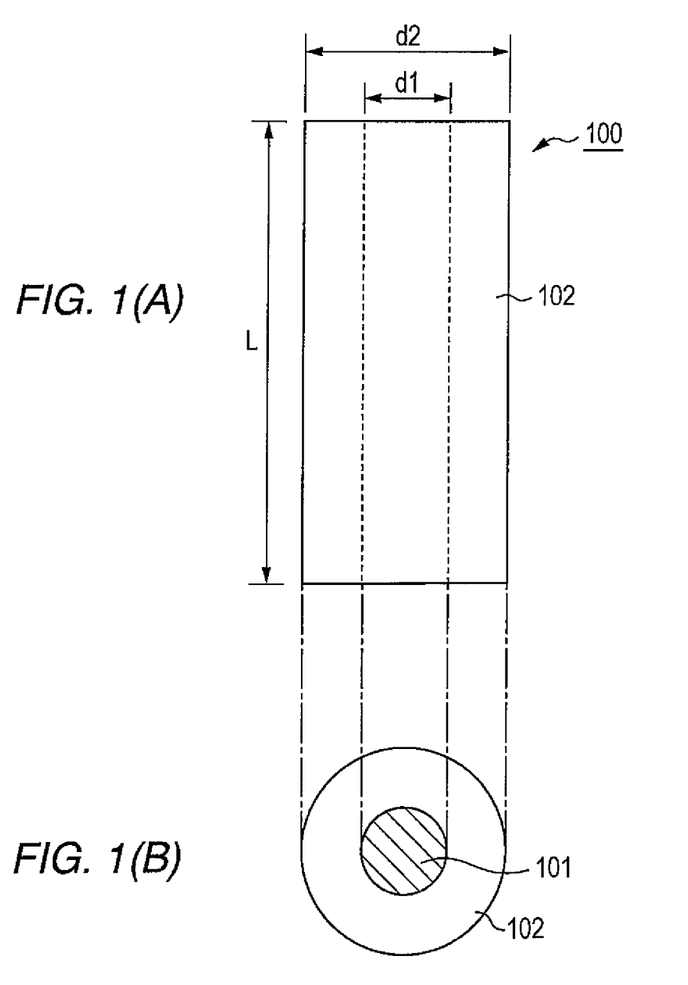
FIG. 1(A) is a side view of thermoelectric conversion element according to the present invention.
FIG. 1(B) is a bottom view of thermoelectric conversion element according to the present invention.

FIG. 1(A) and FIG. 1(B) illustrate thermoelectric conversion element 100 according to Embodiment 1 of the present invention. FIG. 1(A) is a side view of thermoelectric conversion element 100 and FIG. 1(B) is a bottom view of thermoelectric conversion element 100. In FIG. 1(A) and FIG. 1(B), reference numeral 101 denotes a thermoelectric conversion material. 102 denotes a tube made of heat-resisting insulating material. Thermoelectric conversion material 101 is in close contact with the inner perimeter surface of tube 102 filling the interior of tube 102. For example, overall length L of thermoelectric conversion element 100 is about 1.3 to about 3.0 mm, inner diameter d1 of tube 102 is about 1.8 mm and outer diameter d2 of tube 102 is about 3.0 mm.

Thermoelectric conversion material 101 is a material that produces an electromotive force when a temperature difference is produced between both ends thereof. Thermoelectric conversion material 101 may be selected according to a temperature difference produced when in use. An example of thermoelectric conversion material 101 is a $Bi_2Te_3$-based material. A P-type thermoelectric conversion material or N-type thermoelectric conversion material can be obtained by adding, for example, an appropriate dopant to the thermoelectric conversion material. An example of such a dopant for obtaining a P-type thermoelectric conversion material is Sb. An example of such a dopant for obtaining an N-type thermoelectric conversion material is Se. With these dopants, the thermoelectric conversion material forms a mixed crystal. Therefore, these dopants are added to the thermoelectric conversion materials on the order of amount expressed by compositional formulas of thermoelectric conversion materials such as "$Bi_{0.5}Sb_{1.5}Te_3$" and "$Bi_2Te_{2.7}Se_{0.3}$."

Tube 102 is a tube made of heat-resisting and insulating material. Tube 102 has such heat resistance that its shape is stably kept even at a maximum temperature in an environment in which the thermoelectric conversion element is used or at a melting point of the thermoelectric conversion material. Furthermore, tube 102 has insulating properties of cutting a current of thermoelectric conversion material 101. Tube 102 is preferably cylindrical from the standpoint of arranging thermoelectric conversion elements at a high density in the thermoelectric conversion element module. Examples of the material of tube 102 include metal oxide such as silica, alumina, or heat-resisting glass, quartz. The material of tube 102 is preferably quartz from the standpoint of heat resistance and is further preferably heat-resisting glass in consideration of cost.

Figure 2:
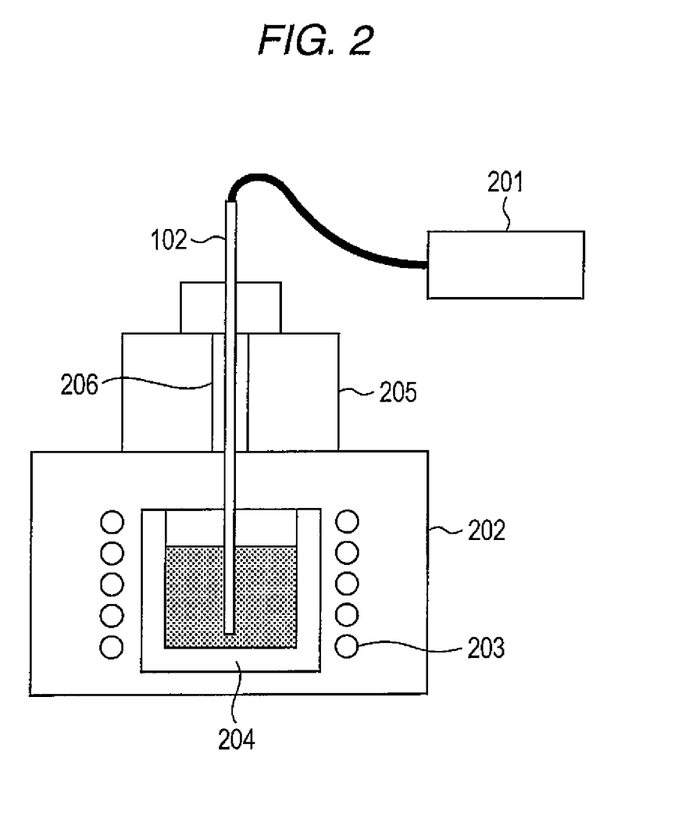
FIG. 2 is a diagram illustrating an overview of a first example of an apparatus for manufacturing a thermoelectric conversion element according to the present invention.

Next, an apparatus for manufacturing thermoelectric conversion element 100 will be described. FIG. 2 is a diagram schematically illustrating a configuration of a first example of the apparatus for manufacturing a thermoelectric conversion element of the present invention.

As shown in FIG. 2, the apparatus 11 for manufacturing thermoelectric conversion element 100 includes chamber 202, crucible 204 accommodated in chamber 202 that can store the molten thermoelectric conversion material, coil 203 for heating the thermoelectric conversion material of crucible 204, preheating apparatus 205 arranged on the chamber and decompression apparatus 201 (also denoted by "X") connected to tube 102 that is inserted into crucible 204. As an induction heating apparatus, for example coil 203 can be used. Chamber 202 is, for example, a muffle furnace having coil 203 and crucible 204.

Crucible 204 is, for example, a carbon bottomed cylindrical recipient. Preheating apparatus 205 includes, for example, a cylindrically arranged resistance heating apparatus. In this case, the cylindrical space formed by the resistance heating apparatus may be used as passage 206 that communicates the outer space above chamber 202 with the interior of chamber 202. Passage 206 can also be formed using a metallic cylinder such as aluminum. A cover for opening/closing passage 206 is arranged above passage 206. For example, the preheating apparatus 205 has a passage 206 extending from one main surface to the other main surface. The passage 206 communicates inside part of the crucible and outside of the preheating apparatus. The tube 102 can be inserted in the passage 206, Steps of manufacturing thermoelectric conversion element 100 in FIG. 1 will be described with reference to FIG. 2 and FIG. 3(a) to FIG. 3(e). FIG. 3(a) to FIG. 3(e) are diagrams illustrating an example of the method for manufacturing a thermoelectric conversion element according to the present invention.

Figure 3A:
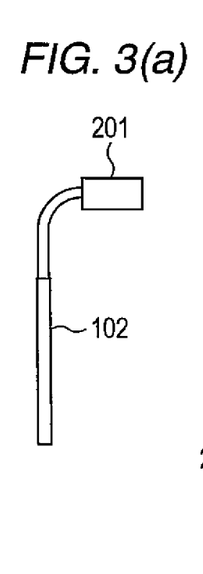

First, as shown in FIG. 3(a), tube 102 made of heat-resisting insulating material is prepared. The material of tube 102 is glass, and is heat-resisting glass (a kind of borosilicate glass which is a mixture of $SiO_2$ and $B_2O_3$, a material having a coefficient of thermal expansion of approximately $3 \times 10^{-6}$/K) in particular. As heat-resisting glass, Pyrex (registered trademark) glass manufactured by Corning Incorporated is generally known. Tube 102 prepared here is a heat-resisting glass tube having, for example, overall length L of about 150 mm, inner diameter d1 of about 1.8 mm and outer diameter d2 of about 3.0 mm.

Next, as shown in FIG. 2, a pipe 103 is connected to one end of tube 102 and the other end of the pipe is connected to decompression apparatus 201. Crucible 204 in chamber 202 whose atmosphere is substituted by a non-oxidation atmosphere beforehand is heated to a predetermined temperature using coil 203 so as to melt thermoelectric conversion material 101 in crucible 204. Thermoelectric conversion material 101 is induction-heated by the action of a magnetic field generated from coil 203. Due to a temperature difference between the outer perimeter and inner perimeter of crucible 204 and a temperature difference between the upper and lower parts of a molten liquid, convection is produced in the molten liquid in crucible 204 whereby the molten liquid in crucible 204 is stirred and made uniform.

Figure 3B:
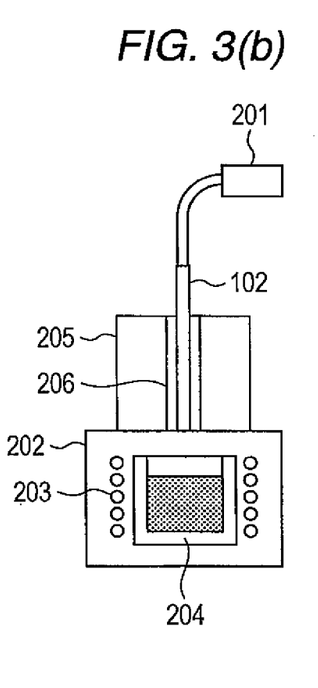

Next, as shown in FIG. 3(b), one end of tube 102 is inserted from above preheating apparatus 205 into passage 206 of preheating apparatus 205. For example, two different temperature bands a and b are formed by the resistance heating apparatus in this order in passage 206 from below along the axis of passage 206. For example, lowest temperature band a is a region of about 500 to about 600° C. and temperature band b thereabove is a region of about 350 to about 450° C. The lengths in the axial direction of the respective temperature bands are the same, but may also be different.

The temperature of the temperature band can be determined according to, for example, the type of the thermoelectric conversion material. When, for example, a p-type thermoelectric conversion material is introduced into tube 102, the thermoelectric conversion material may be preferably cooled relatively slowly. In this case, the temperature of the temperature band is set, for example, to a temperature relatively close to the melting temperature of the thermoelectric conversion material. Furthermore, when an n-type thermoelectric conversion material is introduced into tube 102, the thermoelectric conversion material may be preferably cooled fast. In this case, the temperature of the temperature band is set, for example, to a temperature relatively close to the room temperature.

As shown in FIG. 3(*b*), one end of tube 102 is held inside preheating apparatus 205 for a predetermined time. The one end of tube 102 is thus preheated. Next, as shown in FIG. 3(*c*), tube 102 is further inserted into passage 206 and the one end of tube 102 is immersed in a molten thermoelectric conversion material in crucible 204. Next, air in tube 102 is sucked in by decompression apparatus 201 and molten thermoelectric conversion material 101 is introduced into tube 102. Thus, the thermoelectric conversion material is filled into tube 102.

Figure 3C:
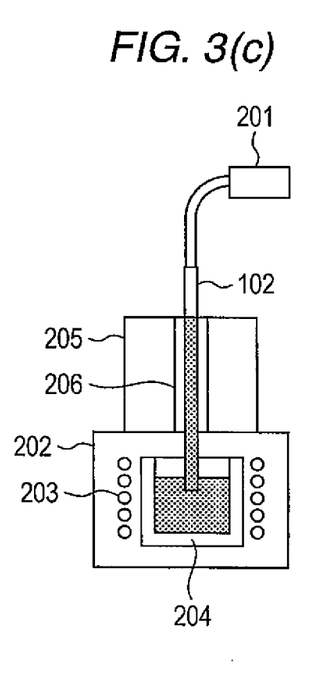
Figure 3D:
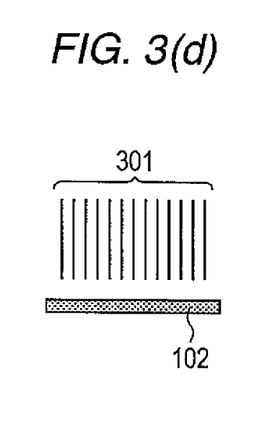
Figure 3E:
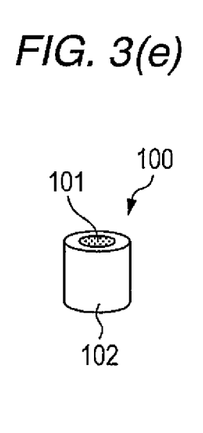

Sucking of thermoelectric conversion material 101 into tube 102 can be stopped by turning the cock of a three-way valve (not shown) which is connected to three parts; for example, decompression apparatus 201, tube 102 and an external space from the direction in which decompression apparatus 201 and tube 102 are connected to the direction in which decompression apparatus 201 and outside air are connected.

After filling thermoelectric conversion material 101 into tube 102, thermoelectric conversion material 101 is solidified according to the temperature of preheated tube 102 and the crystalline state of thermoelectric conversion material 101 is determined. The solidification of thermoelectric conversion material 101 is determined by the temperature of tube 102. Because of the crystalline structure, the preferential growth direction of the thermoelectric conversion material normally becomes a direction perpendicular to the inner wall surface of tube 102.

At this time, by cooling and sucking thermoelectric conversion material in the melted state, the preferential growth direction of the thermoelectric conversion material sucked into tube 102 becomes the direction of a combined vector of a vector indicating the preferential growth direction of cooling and a vector indicating the preferential growth direction of the flow by sucking (direction inclined upward from the inner perimeter wall surface of tube 102). Therefore, the apparatus for manufacturing a thermoelectric conversion element of the present invention can control thermoelectric conversion characteristics associated with the crystallinity of the thermoelectric conversion material by controlling the sucking speed and cooling speed.

Figure 4:
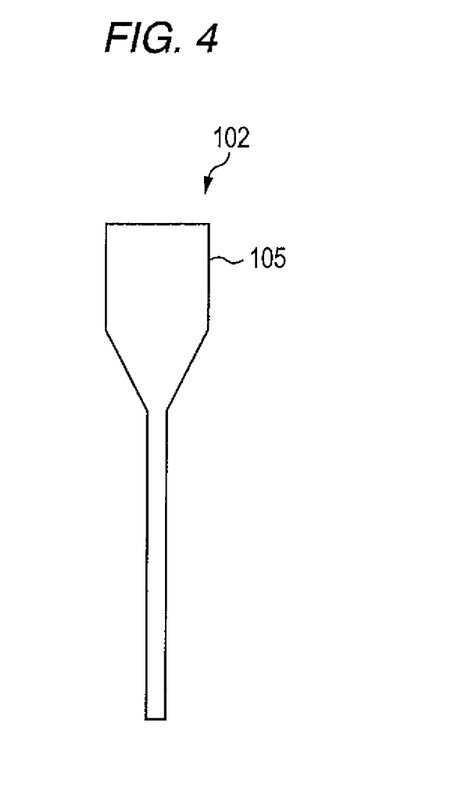
FIG. 4 is a diagram illustrating the shape of a member of the thermoelectric conversion element according to the present invention.

According to the present embodiment, tube 102 has a cylindrical shape with a straight trunk part as shown in FIG. 2 or may also be configured to have an enlarged diameter over a desired length as shown in FIG. 4. FIG. 4 is a diagram illustrating another example of tube 102. Thus, when tube 102 has buffer section 105 which is a portion of tube 102 with an enlarged inner cross-sectional area, the sucking of the molten liquid can be stopped at a predetermined position by decreasing the sucking speed of the molten liquid of the thermoelectric conversion material and relatively increasing the cooling speed.

By the way, since the volume of thermoelectric conversion material 101 decreases after melting, the bonding force of thermoelectric conversion material 101 and tube 102 can decrease significantly inside tube 102. Thus, when the bonding force decreases, thermoelectric conversion material 101 may fall out of tube 102 or a wiring material may break in the gap during the formation of wiring, leading to a short circuit during a cutting process of tube 102. Therefore, it is preferable to manufacture thermoelectric conversion element 100 while the bonding force is strong.

When tube 102 shown in FIG. 4 is used, it is preferable to set the preheating temperature of tube 102 to a relatively high temperature or suck thermoelectric conversion material 101 of tube 102 by decompression apparatus 201, suck it to a predetermined height of tube 102, change the adjustment of the pressure in tube 102 from decompression to compression while the molten liquid of the thermoelectric conversion material in tube 102 is not sufficiently cooled and perform processing so that cooling is carried forward with the pressure of thermoelectric conversion material 101 inside tube 102 increased.

Tube 102 filled with thermoelectric conversion material 101 is cooled by pulling out tube 102 within chamber 202 or via passage 206 from within chamber 202. The thermoelectric conversion material filled in tube 102 is solidified in this way.

After that, as shown in FIG. 3(*d*), thermoelectric conversion material 101 after coagulation and tube 102 are simultaneously cut along a direction perpendicular to the longitudinal direction of tube 102 using wire saw 301. And as shown in FIG. 3(*e*), it is thereby possible to obtain thermoelectric conversion material 101 with tube 102 arranged therearound.

Through the above-described steps of manufacturing a thermoelectric conversion element, it is possible to arrange thermoelectric conversion material 101 in close contact with the interior of tube 102, and thereby suppress "cracking" or "chipping" which becomes problematic when cutting thermoelectric conversion material 101. As a result, it is possible to provide a thermoelectric conversion element with high reliability with respect to the connection between the thermoelectric conversion material and the connection electrode, and also provide a thermoelectric conversion element with high reliability with respect to the exploitation of the thermoelectric conversion capability. Furthermore, since tube 102 itself can play a role as a spacer when arranging individual thermoelectric conversion elements 100 at a high density, it is also possible to obtain thermoelectric conversion elements that can be easily arranged at a high density. The present embodiment has described a state in which one material tube made up of one tube 102 and thermoelectric conversion material 101 filled therein is manufactured as an example, but a plurality of the material tubes may also be simultaneously manufactured.

When thermoelectric conversion material 101 is made to fill the interior of tube 102 using the above-described method, it is possible to reduce the number of times cutting is performed by two times compared to the conventional manufacturing method whereby thermoelectric conversion elements are cut out from a large chunk of thermoelectric conversion material. Thus, the present embodiment also has an advantage in the manufacturing method that it can reduce the number of steps compared to the conventional manufacturing method.

As described so far, the manufacturing apparatus according to the present embodiment has a mechanism of preheating tube 102 prior to the sucking of the molten liquid of the thermoelectric conversion material when filling the interior of tube 102 of hollow heat-resisting insulating material with a p-type or n-type pre-melted thermoelectric conversion material. This mechanism with the preheating capability allows tube 102 to be kept at an optimum temperature, which is different from the heating of crucible 204. Thus, it is possible to allow the sucked thermoelectric conversion material to form a crystalline structure having a crystal orientation capable of fully displaying its characteristic inside tube 102.

A thermoelectric conversion element module is manufactured by cutting tube 102 to obtain p-type or n-type thermoelectric conversion elements, arranging these elements and then electrically connecting both elements.

Thus, the present embodiment can realize an apparatus and a method for manufacturing a thermoelectric conversion element facilitating a high-density array and offering high connection reliability.

Furthermore, the above-described apparatus for manufacturing a thermoelectric conversion element forms a layer of heat-resisting insulating material having a connection electrode between thermoelectric conversion materials in a thermoelectric conversion element group, and can thereby reduce thermal stress generated by a temperature difference between high and low temperatures. Thus, it is also possible to realize a thermoelectric conversion element module structure capable of improving reliability with respect to thermal stress.

Embodiment 2

FIG. 5 is a diagram schematically illustrating a configuration of a second example of the apparatus 12 for manufacturing a thermoelectric conversion element of the present invention. The manufacturing apparatus 12 of the present embodiment is the same as the manufacturing apparatus according to Embodiment 1, instead of tube 103 decompression degree adjusting apparatus 500 is provided.

Decompression degree adjusting apparatus 500 includes buffer chamber 501, pressure gauge 502 (also denoted by "Y") that detects a pressure of buffer chamber 501, two nozzles 503 and 504, valves 505 and 506 that open/close nozzles 503 and 504, and piston 507. Buffer chamber 501 is, for example, a hollow column body. Pressure gauge 502 is arranged on one end face of the column body. Pressure gauge 502 is a differential pressure gauge that detects a pressure lower than an atmospheric pressure as a pressure difference. Nozzles 503 and 504 are arranged on the circumferential surface of the column body. Valves 505 and 506 are, for example, two-way valves that open/close nozzles 503 and 504. Nozzle 503 is connected to tube 102 and nozzle 504 is connected to decompression apparatus 201. Piston 507 is made up of disk 507a making up an inner wall surface at one end of the column body and shaft 507b that is coupled therewith. Shaft 507b is, for example, a screw which is threadedly engaged with a threaded hole that is open on the outer wall at one end of buffer chamber 501. Rotating shaft 507b causes disk 507a to freely move forward or backward in the axial direction of the column body and fixes disk 507a at a desired position.

When a thermoelectric conversion element is manufactured using the manufacturing apparatus of the present embodiment, tube 102 is connected to nozzle 503 and decompression apparatus 201 is connected to nozzle 504. Furthermore, the volume of buffer chamber 501 is adjusted. The volume of buffer chamber 501 is determined according to, for example, a desired amount of sucking of the molten thermoelectric conversion material. The volume of buffer chamber 501 is adjusted by fixing the position of piston 507 at a desired position. Next, the inner pressure of buffer chamber 501 is adjusted. The inner pressure of buffer chamber 501 is determined according to the viscosity and density of the molten thermoelectric conversion material. The inner pressure of buffer chamber 501 is adjusted by closing valve 505, opening valve 506 and setting the inner pressure of buffer chamber 501 to a negative pressure by decompression apparatus 201. When the inner pressure of buffer chamber 501 is lowered down to a desired pressure value by pressure gauge 502, valve 506 is closed.

Next, as shown in FIG. 3(b), tube 102 is preheated. Next, one end of tube 102 is inserted into crucible 204 and valve 503 is opened. By opening valve 503, the thermoelectric conversion material is sucked into tube 102 by an amount and at a speed corresponding to the volume of buffer chamber 501 and the inner pressure of buffer chamber 501. Thus, by connecting buffer chamber 501 whose decompression degree is adjusted at the other end of tube 102, the thermoelectric conversion material is introduced from one end of tube 102 by a desired amount and at a desired speed.

According to the present embodiment, it is possible to make constant the temperature condition of tube 102 as in the case of Embodiment 1 and stably manufacture a thermoelectric conversion material having a crystalline structure that fully exploits the thermoelectric conversion capability. Furthermore, according to the present embodiment, it is possible to make constant the amount and speed of introducing the thermoelectric conversion material. Thus, the manufacturing apparatus and the manufacturing method according to the present embodiment are still further effective from the standpoint of manufacturing thermoelectric conversion elements of uniform quality.

Embodiment 3

Figure 6A:
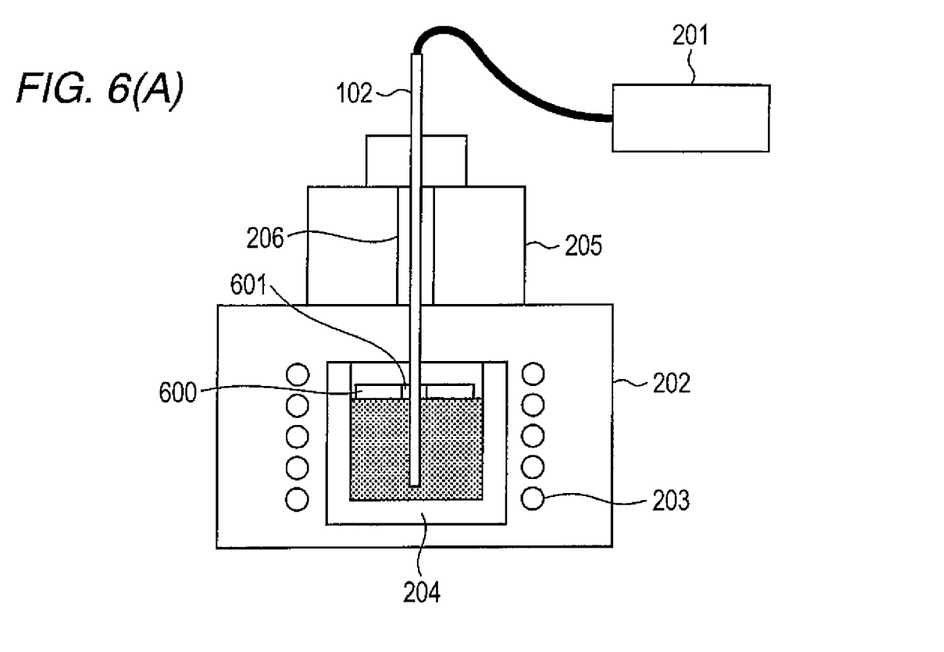
FIG. 6(A) is a diagram illustrating an overview of a third example of the apparatus for manufacturing a thermoelectric conversion element according to the present invention.
Figure 6B:
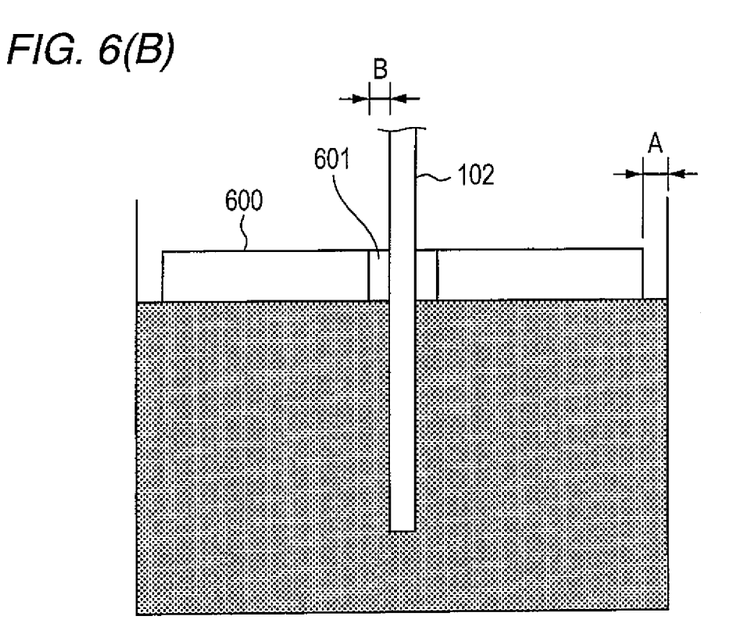
FIG. 6(B) is an enlarged view of main parts in FIG. 6(A)

FIG. 6(A) is a diagram schematically illustrating a configuration of a third example of an apparatus 13 for manufacturing a thermoelectric conversion element of the present invention. FIG. 6(B) is an enlarged view of main parts in FIG. 6(A) (periphery of inner cover 600). The manufacturing apparatus of the present embodiment is the same as the manufacturing apparatus according to Embodiment 1 except that inner cover 600 is further provided.

Inner cover 600 is a carbon disk. The outer diameter of inner cover 600 is slightly smaller than the inner diameter of crucible 204. Inner cover 600 includes through-hole 601 in the center. The hole diameter of through-hole 601 is slightly larger than the outer diameter of tube 102.

The method for manufacturing a thermoelectric conversion element using the manufacturing method of the present embodiment is the same as that of Embodiment 1 except that inner cover 600 is arranged on the thermoelectric conversion material in crucible 204 before melting the thermoelectric conversion material in crucible 204; and tube 102 is inserted into crucible 204 from passage 206 of preheating apparatus 205 via through-hole 601.

The present embodiment suppresses evaporation of the molten thermoelectric conversion material from the crucible. This prevents the composition of the molten thermoelectric conversion material in crucible 204 from changing. Thus, the thermoelectric conversion capability of the thermoelectric conversion element may be improved by the order of about 20 to about 25%. The present embodiment can not only fix the temperature condition of tube 102 but also fix the composition of the thermoelectric conversion material. Therefore, the manufacturing apparatus and the manufacturing method of the present embodiment are still further effective from the standpoint of manufacturing thermoelectric conversion elements of uniform quality.

Inner cover 600 can also be used for the manufacturing apparatus of Embodiment 2. The manufacturing apparatus and the manufacturing method in this case exert all the effects of aforementioned Embodiments 1 to 3.

The present application claims a priority based on Japanese Patent Application No. 2011-087877, filed on Apr. 12, 2011 and Japanese Patent Application No. 2012-030905, filed on Feb. 15, 2012, the disclosure of which is incorporated herein by reference in its entirety.

INDUSTRIAL APPLICABILITY

As described above, the present invention can obtain an apparatus and a method for manufacturing a thermoelectric conversion element allowing a high-density array and having element characteristics with high connection reliability. Therefore, the manufacturing apparatus and the manufacturing method of the present invention are widely applicable to cases where heat needs to be directly converted to electricity in various technical fields.

Other Embodiments

As described above, while the present invention has been described according to the embodiments, the descriptions and the drawings configuring a part of this disclosure do not limit the scope of the present invention. This disclosure allows those skilled in the arts to know a variety of substitutive embodiments, working examples and operational techniques. For example, in the embodiment 1, tube 102 having a circle outer shape in section as shown in FIG. 1(B) was used, but the present invention needs not to be limited to circle outer shape. Thus, other embodiments will be readily apparent to the skilled person without departing from the scope of the appended claims.

REFERENCE SIGNS LIST

5 p-type thermoelectric conversion element
6 n-type thermoelectric conversion element
7 connection electrode
8, 9 external connection terminal
10 substrate
100 thermoelectric conversion element
101 thermoelectric conversion material
102 tube
105 buffer section
201 decompression apparatus
202 chamber
203 coil
204 crucible
205 preheating apparatus
206 passage
301 wire saw
500 decompression degree adjusting apparatus
501 buffer chamber
502 pressure gauge
503, 504 nozzle
505, 506 valve
507 piston
507*a* disk
507*b* shaft
600 inner cover
601 through-hole
H arrow indicating heat flow direction

What is claimed is:

1. An apparatus for manufacturing a thermoelectric conversion element, comprising:
    a crucible configured to store a molten thermoelectric conversion material;
    a heating apparatus arranged on an outer perimeter of the crucible, the heating apparatus being configured to heat the thermoelectric conversion material in the crucible to a temperature equal to or higher than a melting temperature of the thermoelectric conversion material;
    a preheating apparatus arranged above the crucible;
    a passage as part of the preheating apparatus, the passage configured to communicate between inside part of the crucible and an upper side of the heating apparatus;
    a tube made out of heat-resistant insulating material and configured to be heated by the preheating apparatus to a temperature lower than the melting temperature, a first end of the tube inserted into the crucible via the passage; and
    a decompression apparatus connected to the second end of the tube.

2. The apparatus for manufacturing a thermoelectric conversion element according to claim 1, further comprising a buffer chamber connected to the decompression apparatus and the one end of the tube, the buffer chamber is configured to freely open/close independently of the decompression apparatus and the tube.

3. The apparatus for manufacturing a thermoelectric conversion element according to claim 1, further comprising an inner cover accommodated in the crucible, wherein the inner cover comprises a through-hole through which the tube is passed.

4. The apparatus for manufacturing a thermoelectric conversion element according to claim 1, wherein the heating apparatus is an induction heating apparatus that performs induction heating and the heating source of the preheating apparatus is a heating apparatus that performs heating other than induction heating.

5. The apparatus for manufacturing a thermoelectric conversion element according to claim 1, further comprising a chamber that accommodates the crucible.

6. The apparatus for manufacturing a thermoelectric conversion element according to claim 2, further comprising an inner cover accommodated in the crucible, wherein the inner cover comprises a through-hole through which the tube is passed.

* * * * *